(12) United States Patent
Kobayashi et al.

(10) Patent No.: US 7,418,694 B2
(45) Date of Patent: Aug. 26, 2008

(54) METHOD FOR GENERATING TEST PATTERNS UTILIZED IN MANUFACTURING SEMICONDUCTOR DEVICE

(75) Inventors: Sachiko Kobayashi, Ichikawa (JP); Atsuhiko Ikeuchi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 175 days.

(21) Appl. No.: 11/516,783

(22) Filed: Sep. 7, 2006

(65) Prior Publication Data

US 2007/0051950 A1 Mar. 8, 2007

(30) Foreign Application Priority Data

Sep. 7, 2005 (JP) ............................. 2005-259903

(51) Int. Cl.
  G06F 17/50 (2006.01)
  G06F 19/00 (2006.01)
  G03F 1/00 (2006.01)
  G21K 5/00 (2006.01)
(52) U.S. Cl. .............................. 716/21; 716/4; 700/98; 700/110; 700/120; 700/121; 430/5; 378/35
(58) Field of Classification Search .................... 716/21, 716/4; 700/98, 110, 120, 121; 430/5; 378/35
See application file for complete search history.

(56) References Cited

U.S. PATENT DOCUMENTS

| | | | | |
|---|---|---|---|---|
| 5,286,656 A * | 2/1994 | Keown et al. | ............... | 438/218 |
| 6,902,855 B2 * | 6/2005 | Peterson et al. | ............... | 430/30 |
| 6,952,818 B2 | 10/2005 | Ikeuchi | | |
| 2006/0236294 A1 * | 10/2006 | Saidin et al. | ................... | 716/19 |
| 2007/0032896 A1 * | 2/2007 | Ye et al. | ...................... | 700/108 |

FOREIGN PATENT DOCUMENTS

JP     2004-294551     10/2004

OTHER PUBLICATIONS

Qian et al., "Advanced Physical Models for Mask Data Verification and Impacts on Physical Layout Synthesis", Proceedings of Fourth International Symposium on Quality Electronic Design, Mar. 24-26, 2003, pp. 125-130.*

Miwa et al., "A New Method for Calculating One-Dimensional Process Margin in Consideration of Process Variations", 1999 4th International Workshop on Statistical Metrology, 1999, pp. 58-61.*

(Continued)

*Primary Examiner*—Phallaka Kik
(74) *Attorney, Agent, or Firm*—Finnegan, Henderson, Farabow, Garrett & Dunner, L.L.P.

(57) ABSTRACT

A method for generating test patterns utilized in manufacturing a semiconductor device includes creating mini-data concerning a partial area pattern used in designing the semiconductor device, subjecting the mini-data to data processing in accordance with a condition of a manufacturing process of the semiconductor device, thereby creating processed mini-data, extracting a marginless point in the processed mini-data where a process margin is less than a predetermined threshold in a manufacturing process of the semiconductor device, determining a class of the marginless point in accordance with a criticality and a category of the marginless point, determining a parameter and a range of the parameter used for the marginless point in accordance with the class of the marginless point, and generating a plurality of test patterns to which different values of the parameter are respectively applied within the range.

20 Claims, 11 Drawing Sheets

OTHER PUBLICATIONS

Inoue et al., "Level-Specific Strategy of KrF Microlithography for 130 nm DRAMs", International Electron Devices Meeting, Dec. 5-8, 1999, pp. 809-812.*

Kobayashi et al., "Mask Manufacturing System, Mask Data Creating Method and Manufacturing Method of Semiconductor Device", U.S. Appl. No. 11/440,086, filed May 25, 2006.

* cited by examiner

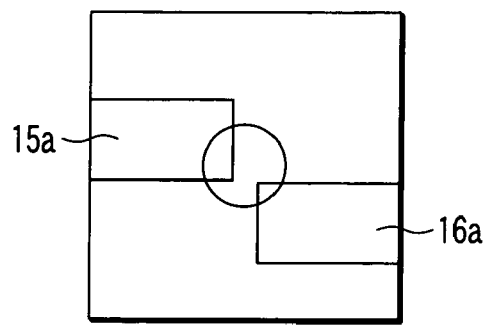
F I G. 5A
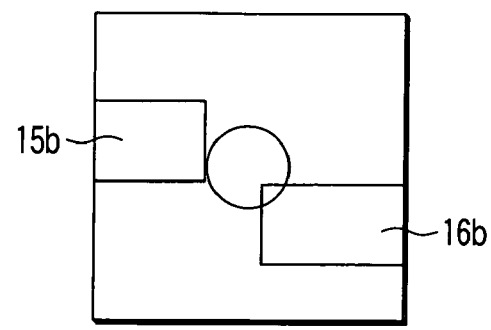
F I G. 5B
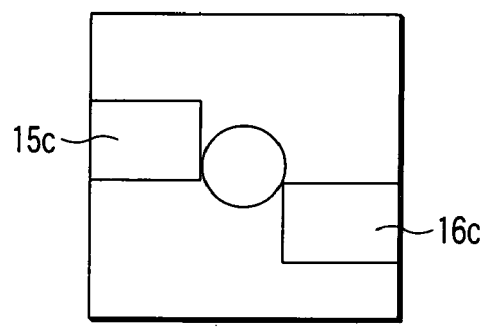
F I G. 5C
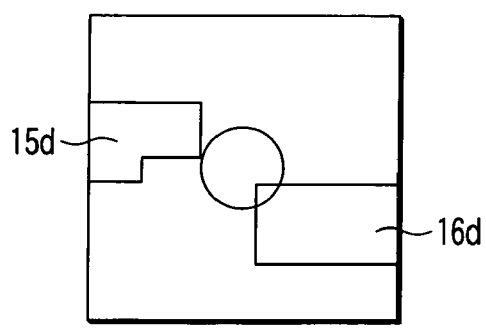
F I G. 5D
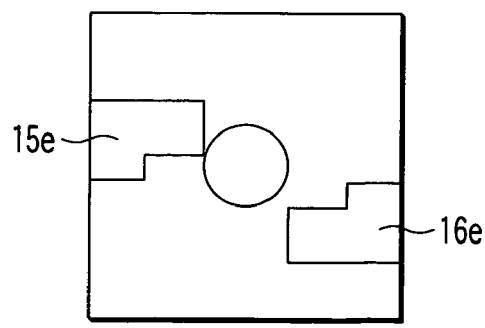
F I G. 5E

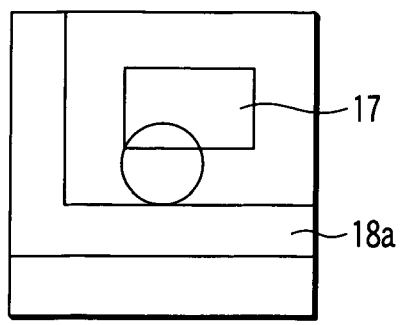
F I G. 6A
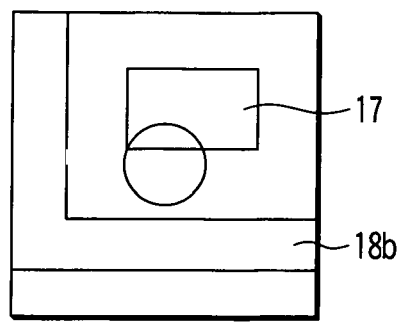
F I G. 6B
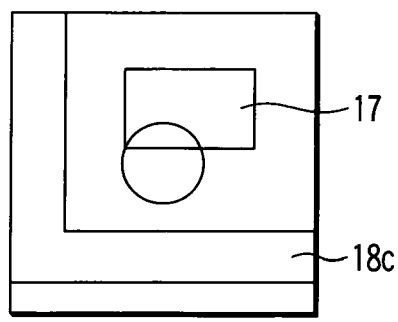
F I G. 6C
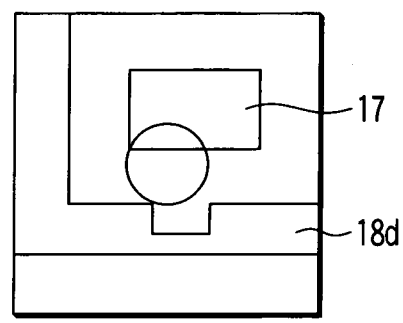
F I G. 6D
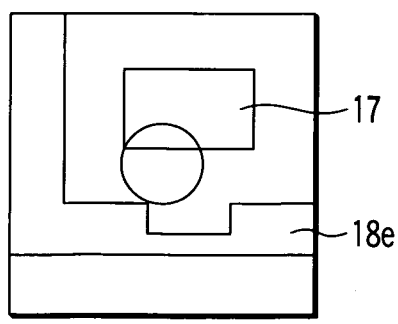
F I G. 6E
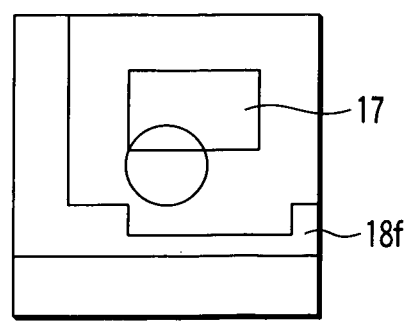
F I G. 6F

METHOD FOR GENERATING TEST PATTERNS UTILIZED IN MANUFACTURING SEMICONDUCTOR DEVICE

CROSS-REFERENCE TO RELATED APPLICATIONS

This application is based upon and claims the benefit of priority from prior Japanese Patent Application No. 2005-259903, filed Sep. 7, 2005, the entire contents of which are incorporated herein by reference.

BACKGROUND OF THE INVENTION

1. Field of the Invention

The present invention relates to a method for generating test patterns utilized in manufacturing a semiconductor device. The present invention also relates to a computer readable medium, a method for making a photo mask, and a method for manufacturing a semiconductor device, which are associated with a method for generating test patterns.

2. Description of the Related Art

In manufacturing semiconductor integrated circuits, the integration degree of devices formed in wafers is increased, and the design rule thereof is miniaturized. Consequently, influences of an optical proximity effect (OPE) have become prominent such that patterns are not transferred onto wafers in predetermined shapes or sizes. This problem requires a certain technique, such as optical proximity effect correction (OPC) or process proximity effect correction (PPC), which is performed on a mask to compensate for a process conversion difference due to the OPE, thereby ensuring that transferred shapes agree with predetermined design patterns. Use of the OPC or PPC makes it possible to suppress fluctuations in the critical dimension (CD) on a wafer, so that miniaturized patterns on the wafer are faithful to the design (for example, Jpn. Pat. Appln. KOKAI Publication No. 2004-294551). Further, there are proposed or performed resolution enhancement techniques (RET) for improving resolution by adjusting the illumination and/or mask, such as insertion of auxiliary patterns smaller than the resolution limit (sub resolution assist feature: SRAF), a phase shift mask of the Levenson type, polarized illumination, and multi-phase light exposure.

Where mask data is created, at first, all the necessary verifications and/or corrections are applied to design data, and the data thus prepared is once fixed and taped out. Then, the data is subjected to various types of processes, such as OPC, to create mask data, in a mask data process. Then, the data is verified by a simulation of lithography and/or transfer onto wafers. As a result, pattern configurations (marginless points) may be found to bring about problems such that the process yield will be low due to open/short defects and process margins will come short. If a pattern configuration including a marginless point is present, and its criticality is high enough to require correction, the correction has to be made back to a design data level. In this case, it is necessary to re-perform various types of verification and process, such as design rule checking before tape-out, data transmission, data reception examination, mask data process, OPC, and mask data verification. This deteriorates the turnaround time (TAT) and cost of data preparation.

Accordingly, uncorrectable pattern configurations and margin-short shapes (marginless points) should be estimated in advance as early as possible, so that design rules, OPC rules, and/or verification rules can be amended to prevent these problems. However, estimation of marginless points in advance entails difficulties, as follows. For example, there is a case where high-accuracy etching simulation is not feasible enough and thus process estimation is difficult to accurately perform. In this case, it is necessary to actually form patterns on a wafer to accurately examine the conversion difference of a process including etching. Further, there is a case where a corrected pattern shape (correction amount) cannot be easily estimated from an input pattern shape. In this case, in order to find marginless points caused after OPC, it is necessary to actually apply an MDP (mask data process) and/or an OPC process to patterns in place of desk experiments, which requires complex calculation and much time. Furthermore, marginless points may generate open/short defects, depending on various combinations of the vertical and horizontal dimensions of shapes. Accordingly, the coordination of pattern categories with correction methods is complex and requires a number of tests for various combinations of pattern configurations.

In consideration of these problems, it is necessary to design a large number of combinations of conceivable test patterns to extract and verify marginless points while performing mask data creation, mask making, transfer onto a wafer, and electron microscope measurement. Consequently, uncorrectable pattern configurations and margin-short shapes even in a corrected state can be found in advance as early as possible, and fed back to design rules, OPC rules, and/or verification rules.

However, variation of pattern configurations that require verification is very broad. Test pattern design can be performed quickly to some extent by an automation tool, but electron microscope measurement entails much manpower and time. Accordingly, in order to perform the measurement within limited time and manpower, the measurement is typically performed only on a limited number of portions, such as portions at and near pattern configurations decided in advance. In this case, outside the measured portions, a hazard pattern or margin-short pattern present may be overlooked, and cannot be suitably fed back to design rules or verification rules. As described above, according to the conventional method, it is difficult to efficiently estimate and/or extract marginless points. Consequently, problems arise such that the TAT of semiconductor manufacturing processes is prolonged because real marginless points are overlooked or extracted with a delay, and/or the process yield is deteriorated due to insufficient process margins of marginless points.

BRIEF SUMMARY OF THE INVENTION

According to a first aspect of the present invention, there is provided a method for generating test patterns utilized in manufacturing a semiconductor device, the method comprising: creating mini-data concerning a partial area pattern used in designing the semiconductor device; subjecting the mini-data to data processing in accordance with a condition of a manufacturing process of the semiconductor device, thereby creating processed mini-data; extracting a marginless point in the processed mini-data where a process margin is less than a predetermined threshold in a manufacturing process of the semiconductor device; determining a class of the marginless point in accordance with a criticality and a category of the marginless point; determining a parameter and a range of the parameter used for the marginless point in accordance with the class of the marginless point; and generating a plurality of test patterns to which different values of the parameter are respectively applied within the range.

According to a second aspect of the present invention, there is provided a computer readable medium containing program instructions for execution on a processor, which, when executed by the processor, cause a system for generating test patterns utilized in manufacturing a semiconductor device, to execute: creating mini-data concerning a partial area pattern used in designing the semiconductor device; subjecting the mini-data to data processing in accordance with a condition of a manufacturing process of the semiconductor device, thereby creating processed mini-data; extracting a marginless point in the processed mini-data where a process margin is less than a predetermined threshold in a manufacturing process of the semiconductor device; determining a class of the marginless point in accordance with a criticality and a category of the marginless point; determining a parameter and a range of the parameter used for the marginless point in accordance with the class of the marginless point; and generating a plurality of test patterns to which different values of the parameter are respectively applied within the range.

According to a third aspect of the present invention, there is provided a method for making a photo mask utilized in manufacturing a semiconductor device, by transferring a pattern of mask data onto a mask substrate, wherein the mask data is created by: creating mini-data concerning a partial area pattern used in designing the semiconductor device; subjecting the mini-data to data processing in accordance with a condition of a manufacturing process of the semiconductor device, thereby creating processed mini-data; extracting a marginless point in the processed mini-data where a process margin is less than a predetermined threshold in a manufacturing process of the semiconductor device; determining a class of the marginless point in accordance with a criticality and a category of the marginless point; determining a parameter and a range of the parameter used for the marginless point in accordance with the class of the marginless point; generating a plurality of test patterns to which different values of the parameter are respectively applied within the range; and performing a test using the test patterns, and feeding back a result of the test to a design rule to create the mask data.

According to a fourth aspect of the present invention, there is provided a method for manufacturing a semiconductor device, the method comprising: creating mini-data concerning a partial area pattern used in designing the semiconductor device; subjecting the mini-data to data processing in accordance with a condition of a manufacturing process of the semiconductor device, thereby creating processed mini-data; extracting a marginless point in the processed mini-data where a process margin is less than a predetermined threshold in a manufacturing process of the semiconductor device; determining a class of the marginless point in accordance with a criticality and a category of the marginless point; determining a parameter and a range of the parameter used for the marginless point in accordance with the class of the marginless point; generating a plurality of test patterns to which different values of the parameter are respectively applied within the range; performing a test using the test patterns, and feeding back a result of the test to a design rule to create the mask data; transferring a pattern image of a photo mask made in accordance with the mask data onto a photo-resist film to form a resist pattern on a target substrate on which the semiconductor device is to be manufactured; and processing the target substrate while using the resist pattern as a mask.

BRIEF DESCRIPTION OF THE SEVERAL VIEWS OF THE DRAWING

FIG. 5A is a view showing the pattern of a further alternative example of mini-data according to the first embodiment;

FIGS. 5B to 5E are views showing test patterns derived from the pattern shown in FIG. 5A;

FIG. 6A is a view showing the pattern of a further alternative example of mini-data according to the first embodiment;

FIGS. 6B to 6F are views showing test patterns derived from the pattern shown in FIG. 6A;

DETAILED DESCRIPTION OF THE INVENTION

Figure 1:
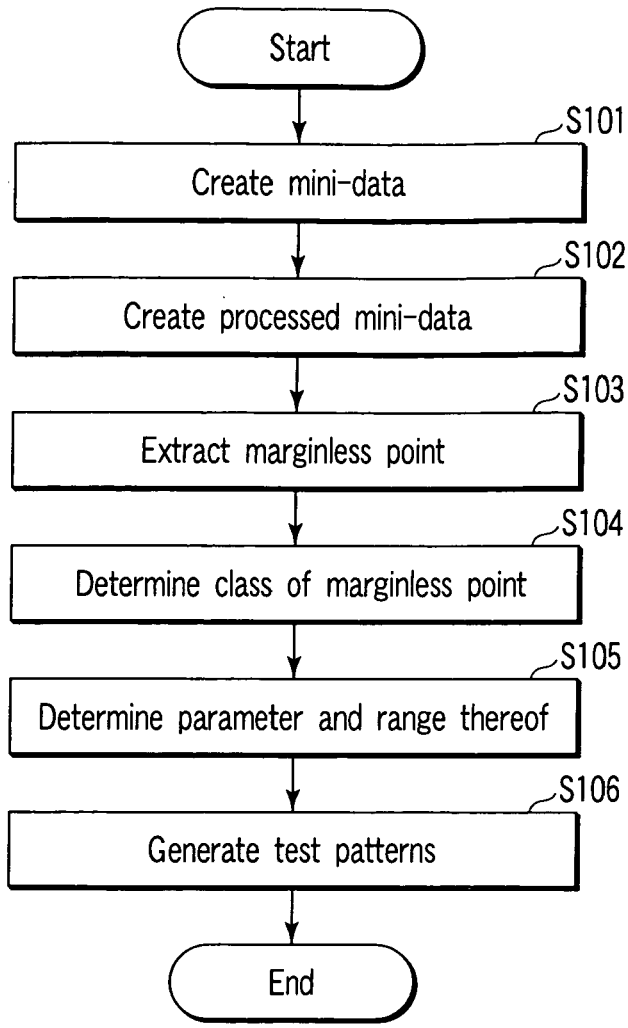
FIG. 1 is a flow chart showing a method for generating test patterns according to a first embodiment of the present invention.

Embodiments of the present invention will now be described with reference to the accompanying drawings. In the following description, the constituent elements having substantially the same function and arrangement are denoted by the same reference numerals, and a repetitive description will be made only when necessary. Further, the drawings are schematic, and thus include differences from real arrangements, such as the relationship between a thickness and a planar dimension and the ratio of thickness between layers. Accordingly, specific thicknesses and dimensions should be determined in accordance with the following explanation. Furthermore, as needed, the drawings show an arrangement differently from each other in terms of the relationship and ratio of dimensions.

First Embodiment

FIG. 1 is a flow chart showing a method for generating test patterns according to a first embodiment of the present invention. This method is used for generating test patterns utilized in manufacturing a semiconductor device, and includes steps S101 to S106, as shown in the flow chart of FIG. 1. In summary, the step S101 is arranged to create mini-data concerning a partial area pattern used in designing a semiconductor device. The step S102 is arranged to subject the mini-data to data processing in accordance with a condition of a manufacturing process of the semiconductor device, thereby creating processed mini-data. The step S103 is arranged to extract a marginless point in the processed mini-data where a process margin is less than a predetermined threshold in a manufacturing process of the semiconductor device. The step S104 is arranged to determine a class of the marginless point in accordance with the criticality and category of the marginless point. The step S105 is arranged to determine a parameter and a range of the parameter used for the marginless point in accordance with the class of the marginless point. The step S106 is arranged to generate a plurality of test patterns to which different values of the parameter are respectively applied within the range. Next, an explanation will be given of these steps in detail.

Figure 2:
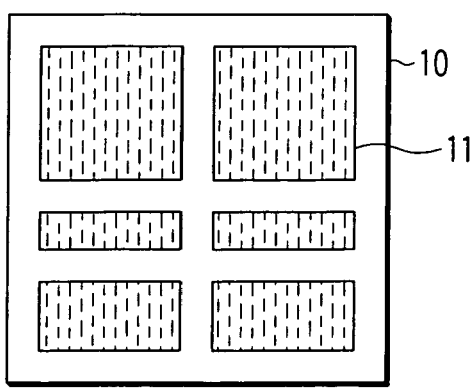
FIG. 2 is a view showing a conceptual pattern of mini-data used in a method for generating test patterns according to the first embodiment.

(1) In the step S101, various types of mini-data are created on the basis of the design rule of a semiconductor device. The term "mini-data" means miniature data formed by gathering specific patterns having various characteristics concerning shapes, configurations, and performances. FIG. 2 is a view showing a conceptual pattern of mini-data used in a method for generating test patterns according to the first embodiment. As shown in FIG. 2, mini-data 10 comprises partial area patterns used in designing a semiconductor device, such as a group of patterns 11 according to a previous-generation design rule. Further, the mini-data 10 may include margin-short patterns found in the past and/or margin-short patterns found in processes. Furthermore, the mini-data 10 may comprise a layout according to a similar design rule.

(2) In the step S102, the mini-data is subjected to data processing in accordance with a condition of a manufacturing process of the semiconductor device, thereby creating processed mini-data. In this embodiment, a lithography process exemplifies a manufacturing process of the semiconductor device, so the data processing may be a mask data process, OPC process, or RET process.

(3) In the step S103, a marginless point in the processed mini-data is extracted where a process margin is less than a predetermined threshold in a manufacturing process (lithography process) of the semiconductor device. For example, the process margin is a focus margin, dose margin, or alignment margin. The processed mini-data is examined by a lithography simulation or design rule checker to extract a portion (marginless point) where a margin is less than a predetermined threshold. For example, a marginless point is a portion where it is highly possible that the process suffers a problem, such as open error, short error, shorting error, corner short error, or edge placement error.

An open error is an error in which interconnections or patterns that need to be connected are separated. A short error is an error in which interconnections or patterns that need to be separated are connected. A shorting error is an error in which a pattern end, such as a line end, shrinks, so the design pattern is not accurately transferred. An edge placement error is an error in which a side of a pattern is transferred but is shifted from a desired position. A method for extracting a marginless point may comprise, for example, a technique of extracting a pattern centering on the marginless point within a range to which a proximity effect exerts.

(4) In the step S104, a class of the marginless point is determined in accordance with the criticality and category of the marginless point. For example, the category of a marginless point is a focus margin, dose margin, alignment margin, or error generation manner. The error generation manner is exemplified by a shape where an open error is likely to occur due to defocus or a shape where a short error is likely to occur due to an overdose. The class of a marginless point may be determined by a lithography rule checker or design rule checker. The criticality applied to a shape that is likely to cause an error may be graded in accordance with the magnitude degree of each margin.

(5) In the step S105, a parameter and a range of the parameter used for the marginless point are determined in accordance with the class of the marginless point. Specifically, for a pattern that may cause an error, the type and range (value range) of a parameter used in a test with the pattern are determined, wherein the parameter is defined by, e.g., a line width, line-space width, or positional shift amount of the pattern in the X-Y plane. Further, the parameter may include the presence and absence of a jog that forms a step or cut in a pattern (an irregular form defined in the X-Y planar).

(6) In the step S106, a plurality of test patterns are generated, to which different values of the parameter are respectively applied within the range. Specifically, on the basis of the type and value range of the determined parameter used in the test, such as a line width or line-space width, a plurality of test patterns are generated. Next, an explanation will be given of examples of test pattern generation.

Figure 3A:
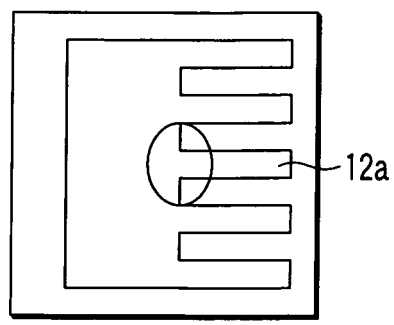
FIG. 3A is a view showing the pattern of an example of mini-data according to the first embodiment.

FIG. 3A is a view showing the pattern of an example of mini-data according to the first embodiment. The pattern of the mini-data shown in FIG. 3A comprises a comb-shaped pattern 12a. The pattern 12a includes a marginless point (a portion surrounded by the symbol "○" in FIG. 3A) at which an open error can be easily caused by an overdose and defocus. On the basis of the pattern 12a, various test patterns are generated, as shown in FIGS. 3B to 3E. In general, a comb-shaped pattern is provided with a jog on the root side, which forms a step portion having a predetermined length depending on, e.g., process and/or OPC parameters.

Figure 3B:
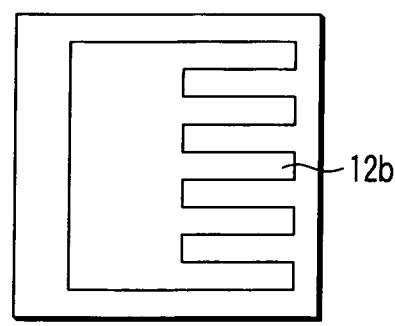
FIGS. 3B to 3E are views showing test patterns derived from the pattern shown in FIG. 3A.
Figure 3C:
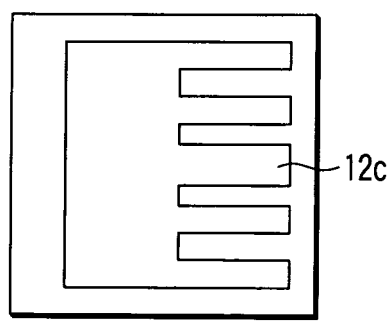
Figure 3D:
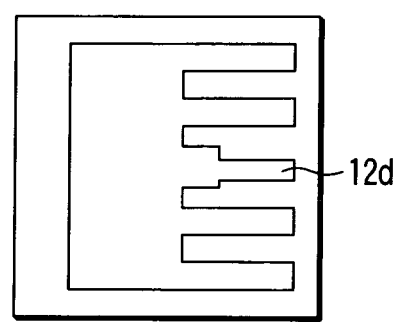
Figure 3E:
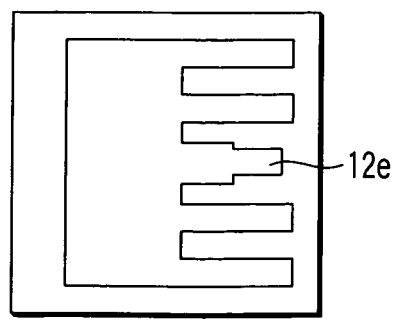

FIGS. 3B to 3E are views showing test patterns derived from the pattern shown in FIG. 3A. The test pattern 12b shown in FIG. 3B is arranged with no jog such that the line width is 5 nm larger, as compared to the pattern 12a. The test pattern 12c shown in FIG. 3C is arranged with no jog such that the line width is 10 nm larger, as compared to the pattern 12a. The test pattern 12d shown in FIG. 3D is arranged with a jog such that a step portion is formed near the marginless point, and the line width is 5 nm larger on its root side, as compared to the pattern 12a. The test pattern 12e shown in FIG. 3E is arranged with a jog such that a step portion is formed near the marginless point, and the line width is 10 nm larger on its root side, as compared to the pattern 12a.

Figure 4A:
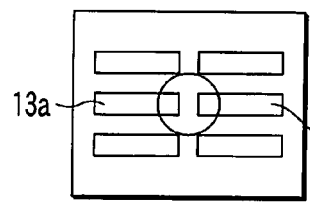
FIG. 4A is a view showing the pattern of an alternative example of mini-data according to the first embodiment.

FIG. 4A is a view showing the pattern of an alternative example of mini-data according to the first embodiment. The pattern of the mini-data shown in FIG. 4A comprises two portions 13a and 14a each including three parallel lines. The pattern 13a+14a includes a marginless point (a portion surrounded by the symbol "○" in FIG. 4A) at which a short error can be easily caused by an underdose and best focus or defocus. On the basis of the pattern 13a+14a, various test patterns are generated, as shown in FIGS. 4B to 4I. In general, such a pattern is provided with a jog at the line end, which forms a step portion having a predetermined length depending on, e.g., process and/or OPC parameters.

Figure 4B:
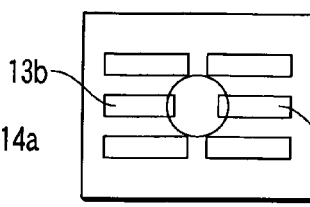
FIGS. 4B to 4I are views showing test patterns derived from the pattern shown in FIG. 4A.
Figure 4C:
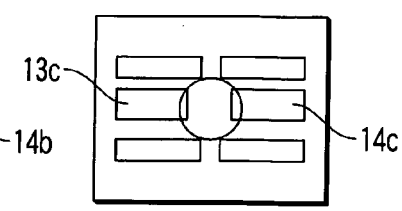
Figure 4D:
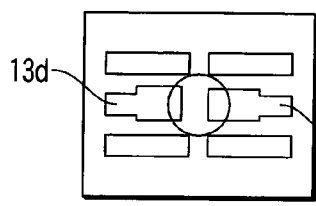
Figure 4E:
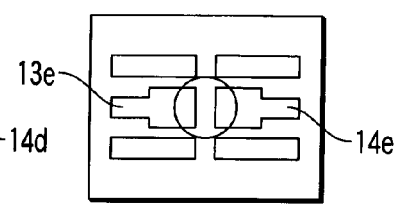

FIGS. 4B to 4I are views showing test patterns derived from the pattern shown in FIG. 4A. The test pattern 13b+14b shown in FIG. 4B is arranged with no jog such that the line width is 5 nm larger, and the distance between portions 13b and 14b is 5 nm larger, as compared to the pattern 13a+14a. The test pattern 13c+14c shown in FIG. 4C is arranged with no jog such that the line width is 10 nm larger, and the distance between portions 13c and 14c is 5 nm larger, as compared to the pattern 13a+14a. The test pattern 13d+14d shown in FIG. 4D is arranged with a jog such that the line width is 5 nm larger near the marginless point, and the distance between portions 13d and 14d is the same, as compared to the pattern 13a+14a. The test pattern 13e+14e shown in FIG. 4E is arranged with a jog such that the line width is 10 nm larger near the marginless point, and the distance between portions 13e and 14e is the same, as compared to the pattern 13a+14a.

Figure 4F:
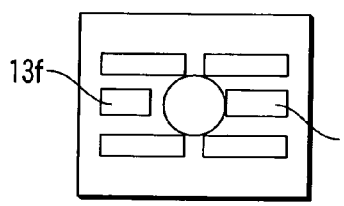
Figure 4G:
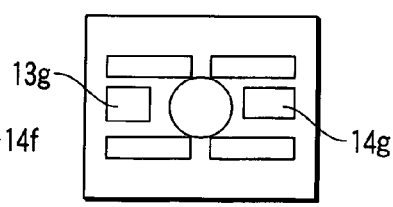
Figure 4H:
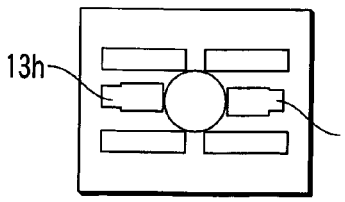
Figure 4I:
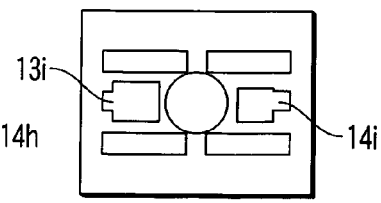

The test pattern 13f+14f shown in FIG. 4F is arranged with no jog such that the line width is 5 nm larger, and the distance between portions 13f and 14f is 10 nm larger, as compared to the pattern 13a+14a. The test pattern 13g+14g shown in FIG. 4G is arranged with no jog such that the line width is 10 nm larger, and the distance between portions 13g and 14g is 10 nm larger, as compared to the pattern 13a+14a. The test pattern 13h+14h shown in FIG. 4H is arranged with a jog such that the line width is 5 nm larger near the marginless point, and the distance between portions 13h and 14h is 10 nm larger, as compared to the pattern 13a+14a. The test pattern 13i+14i shown in FIG. 4I is arranged with a jog such that the line width is 10 nm larger near the marginless point, and the distance between portions 13i and 14i is 10 nm larger, as compared to the pattern 13a+14a.

FIG. 5A is a view showing the pattern of a further alternative example of mini-data according to the first embodiment. The pattern of the mini-data shown in FIG. 5A comprises two portions 15a and 16a each having a rectangular shape. The pattern 15a+16a includes a marginless point (a portion surrounded by the symbol "○" in FIG. 5A) at which a corner short error can be easily caused by an underdose and best focus or defocus. On the basis of the pattern 15a+16a, various test patterns are generated, as shown in FIGS. 5B to 5E.

FIGS. 5B to 5E are views showing test patterns derived from the pattern shown in FIG. 5A. The test pattern 15b+16b shown in FIG. 5B is arranged with no jog such that a portion 15b is further separated from the marginless point by 5 nm, and the portion 16b is disposed at the same position, as compared to the pattern 15a+16a. The test pattern 15c+16c shown in FIG. 5C is arranged with no jog such that each of portions 15c and 16c is further separated from the marginless point by 5 nm, as compared to the pattern 15a+16a. The test pattern 15d+16d shown in FIG. 5D is arranged with a jog such that a portion 15d has a cut at the corner near the marginless point and is further separated from the marginless point by 5 nm, and the portion 16d has the same shape and is disposed at the same position, as compared to the pattern 15a+16a. The test pattern 15e+16e shown in FIG. 5E is arranged with a jog such that each of portions 15e and 16e has a cut at the corner near the marginless point and is further separated from the marginless point by 5 nm, as compared to the pattern 15a+16a.

FIG. 6A is a view showing the pattern of a further alternative example of mini-data according to the first embodiment. The pattern of the mini-data shown in FIG. 6A comprises a rectangular portion 17 and an L-shaped portion 18a. The pattern 17+18a includes a marginless point (a portion surrounded by the symbol "○" in FIG. 6A) at which a short error can be easily caused by an underdose and best focus or defocus. On the basis of the pattern 17+18a, various test patterns are generated, as shown in FIGS. 6B to 6F.

FIGS. 6B to 6F are views showing test patterns derived from the pattern shown in FIG. 6A. The test pattern 17+18b shown in FIG. 6B is arranged with no jog such that an L-shaped portion 18b is further separated from the marginless point by 5 nm, as compared to the pattern 17+18a. The test pattern 17+18c shown in FIG. 6C is arranged with no jog such that an L-shaped portion 18c is further separated from the marginless point by 10 nm, as compared to the pattern 17+18a. The test pattern 17+18d shown in FIG. 6D is arranged with a jog such that an L-shaped portion 18d has a cut of 50 nm on the side facing the marginless point and is further separated from the marginless point by 5 nm, as compared to the pattern 17+18a. The test pattern 17+18e shown in FIG. 6E is arranged with a jog such that an L-shaped portion 18e has a cut of 100 nm on the side facing the marginless point and is further separated from the marginless point by 5 nm, as compared to the pattern 17+18a. The test pattern 17+18f shown in FIG. 6F is arranged with a jog such that an L-shaped portion 18f has a cut of 150 nm on the side facing the marginless point and is further separated from the marginless point by 5 nm, as compared to the pattern 17+18a.

Where a test is performed by use of test patterns having conditions slightly different from each other, as described above, it is possible to swiftly find a condition that causes an error at a position in question. The test patterns described above are merely part of generation examples, and the types and ranges (value ranges) of a larger number of parameters may be required. Pattern shift amounts, ranges, and test parameters are determined in accordance with the categories of marginless points.

The method described above for generating test patterns according to the first embodiment makes it possible to swiftly and efficiently extract hazard shapes. This information is fed back to design rules, OPC rules, and/or verification rules to correct these rules as needed, so that the quality of design data and/or mask data can be improved. Further, the cost for mask data processing can be decreased, and the TAT can be shortened, which improves the process yield.

A method for generating test patterns according to the first embodiment may be stored in a computer readable medium, as program instructions for execution on a processor. In this case, when executed by the processor, the program instructions cause a system for generating test patterns utilized in manufacturing a semiconductor device, to execute the steps S101 to S106 shown in the flow chart of FIG. 1.

Figure 13:
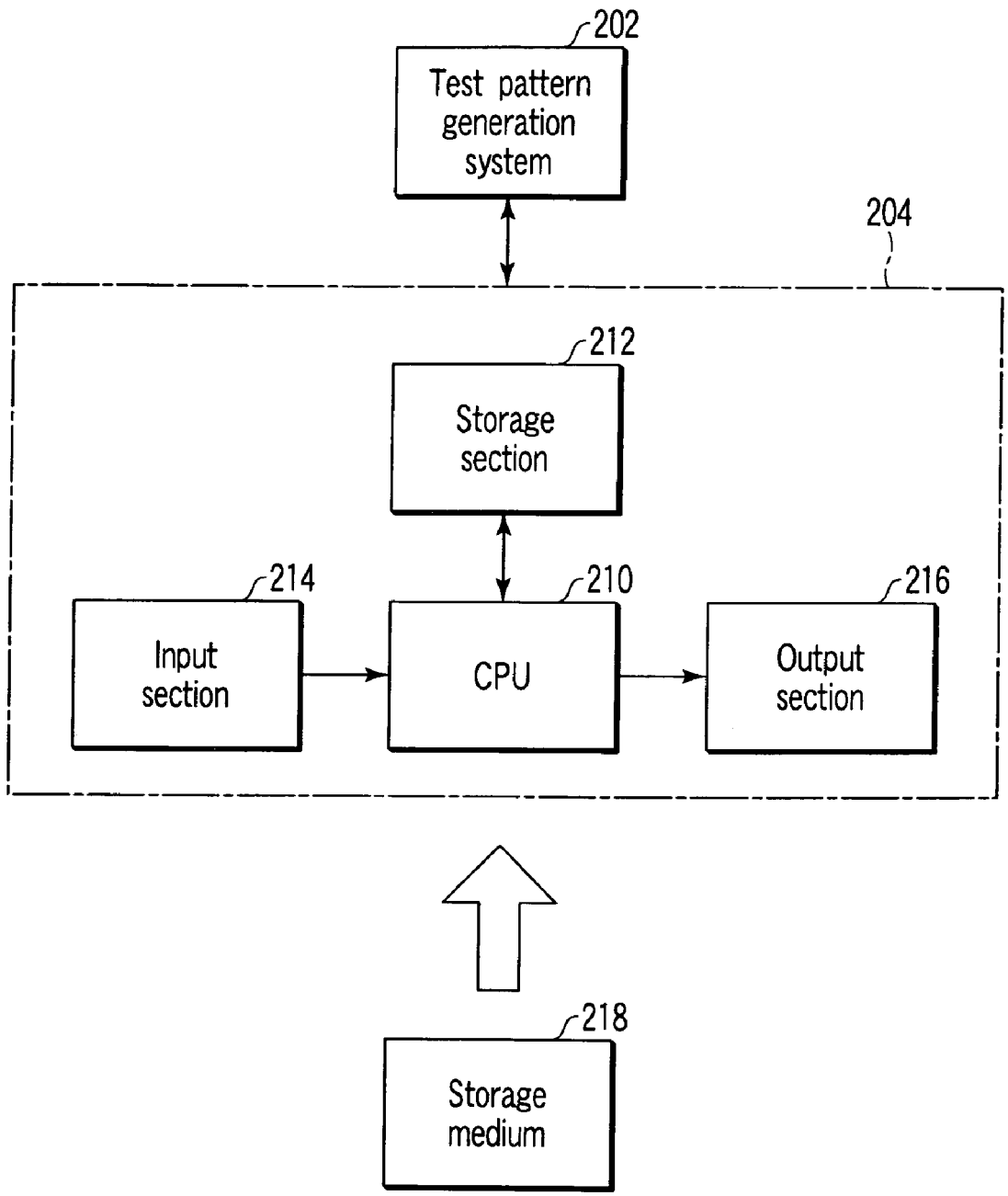
FIG. 13 is a block diagram schematically showing the structure of the main control section of a system for generating test patterns.

FIG. 13 is a block diagram schematically showing the structure of the main control section 204 of a system 202 for generating test patterns. The main control section 48 includes a CPU 210, which is connected to a storage section 212, an input section 214, and an output section 216. The storage section 212 stores process programs and so forth. The input section 214 includes input devices, such as a keyboard, a pointing device, and a storage medium drive, to interact with an operator. The output section 216 outputs control signals for controlling components of the system 202 for generating test patterns. FIG. 13 also shows a storage medium 218 attached to the computer in a removable state.

The method according to the first embodiment may be written as program instructions for execution on a processor, into a computer readable storage medium or media to be applied to the system 202 for generating test patterns. Alternately, program instructions of this kind may be transmitted by a communication medium or media and thereby applied to the system 202 for generating test patterns. Examples of the storage medium or media are a magnetic disk (flexible disk, hard disk (a representative of which is a hard disk included in the storage section 212), etc.), an optical disk (CD, DVD, etc.), a magneto-optical disk (MO, etc.), and a semiconductor memory. A computer for controlling the operation of the system 202 for generating test patterns reads program instructions stored in the storage medium or media, and executes them on a processor, thereby performing the method described above.

Figure 7:
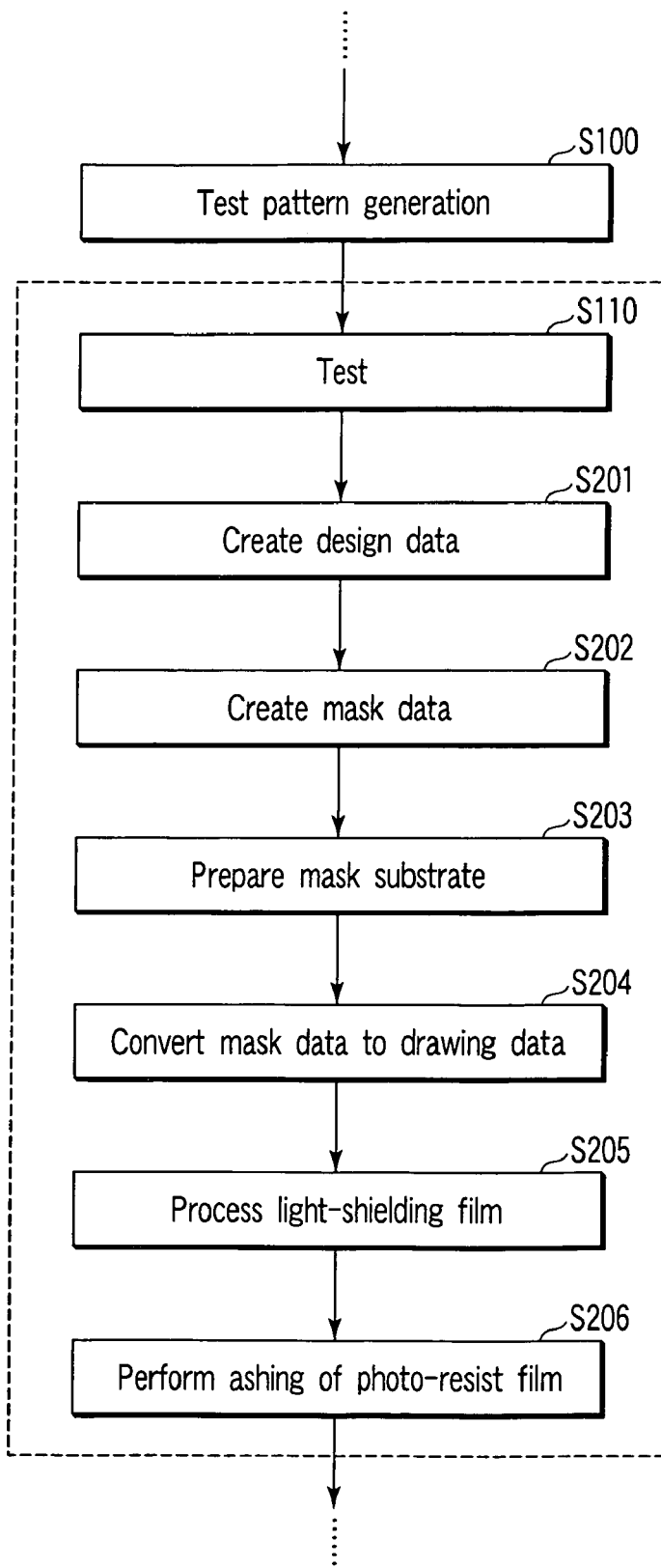
FIG. 7 is a flow chart showing a method for making a mask according to the first embodiment.

FIG. 7 is a flow chart showing a method for making a mask according to the first embodiment.

(1) At first, in a step S100, test patterns are generated in accordance with the steps S101 to S106 of a method for generating test patterns shown in FIG. 1. Then, in the step S110, a test is performed using the test patterns thus generated, to detect shapes that are like to cause errors due to margin shortage and so forth. Then, this information is fed back to design rules, OPC rules, and/or verification rules to correct these rules as needed and to thereby avoid the shapes probably causing errors detected in the step S110.

(2) Then, in a step S201, a process, mask simulation, and/or device simulation are performed to obtain electrical characteristics. Then, a circuit simulation of LSIs is performed using the electrical characteristics to create chip design data of design patterns. At this time, the chip design data is created on the basis of design rules, OPC rules, and/or verification rules corrected by feedback in the step S110.

(3) Then, in a step S202, mask data of mask patterns is created on the basis of the chip design data thus created.

(4) Then, the mask patterns are formed on a mask substrate to make a photo mask. Specifically, in a step S203, a mask substrate is prepared such that a light-shielding film (metal film) made of, e.g., chromium (Cr) is formed on a transparent substrate made of, e.g., quartz glass. Then, a photo-resist is applied onto the substrate, and pre-baking is performed on the substrate. However, in general, mask substrates are provided with a photo-resist film disposed thereon in advance.

(5) Then, in a step S204, the mask data is read out, and is converted into drawing data by a drawing data converter. The mask substrate is mounted onto a mask substrate stage of a pattern generator (PG). Then, the photo-resist film on the mask substrate is subjected to light exposure using the drawing data, and further to development. Consequently, the corrected mask patterns are transferred onto the photo-resist film. Then, cleaning and post-baking (curing) are performed.

(6) Then, in a step S205, the light-shielding film on the mask substrate is processed by, e.g., reactive ion etching (RIE), using a photo-resist film (resist pattern) as a mask.

(7) Then, in a step S206, the remaining photo-resist film is removed by ashing. Consequently, a photo mask is completed such that the mask substrate is provided with the corrected mask patterns. In this manner, a plurality of photo masks corresponding to the respective steps of an LSI manufacturing process are made, so that a set of photo masks is prepared.

The method described above for making a mask according to the first embodiment, which utilizes a method of generating test patterns, makes it possible to swiftly and efficiently extract hazard shapes. This information is fed back to design rules, OPC rules, and/or verification rules to correct these rules as needed, so that the quality of design data and/or mask data can be improved. Further, the cost for mask data processing can be decreased, and the TAT can be shortened, which improves the process yield.

Figure 8:
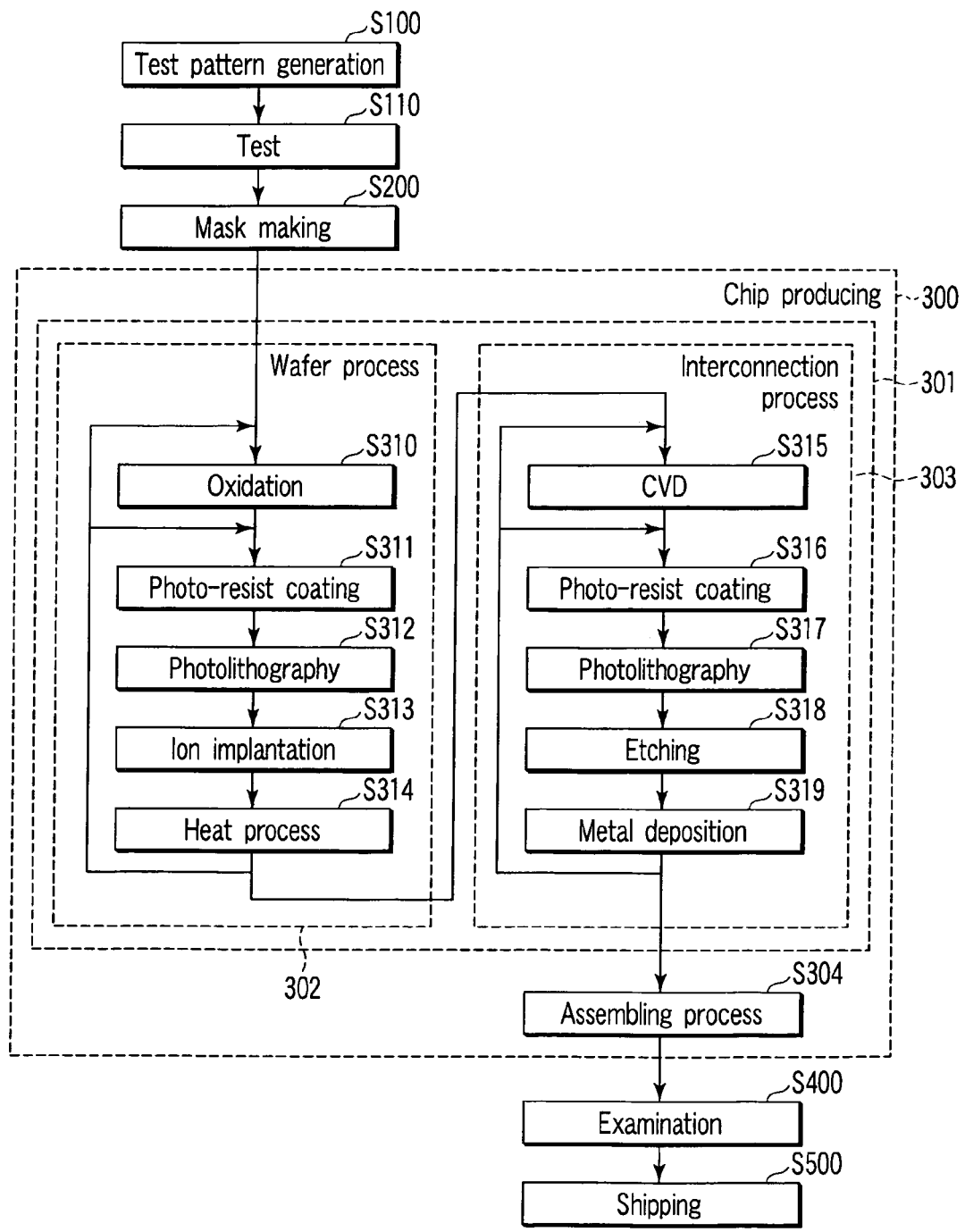
FIG. 8 is a flow chart showing a method for manufacturing a semiconductor device according to the first embodiment.

FIG. 8 is a flow chart showing a method for manufacturing a semiconductor device according to the first embodiment. The method according to the first embodiment described below is only a part of a long series of steps, which may include 100 steps or more, for manufacturing a semiconductor device. The flow chart shown in FIG. 8 is a mere example, and various processes may be executed in accordance with the first embodiment and manners other than the first embodiment.

(1) At first, in a step S100, test patterns are generated in accordance with the steps S101 to S106 of a method for generating test patterns shown in FIG. 1. Then, in the step S110, a test is performed using the test patterns thus generated, to detect shapes probably causing errors due to margin shortage and so forth. Then, this information is fed back to design rules, OPC rules, and/or verification rules to correct these rules as needed and to thereby avoid the shapes probably causing errors detected in the step S110.

(2) Then, in a step S200, a mask is made in accordance with the steps S201 to S206 of a method for making a mask shown in FIG. 7.

Then, a chip producing process is performed. The chip producing process starts with a primary step S301, which includes a step S302 consisting of a front end process (wafer process) and a step S303 consisting of a back end process (surface interconnection process).

(3) In the step S302 consisting of a front end process (wafer process), an oxidation step S310, a photo-resist coating step S311, a photolithography step S312, an ion implantation step S313, and a heat process step S314 are repeatedly performed. In the photolithography step S312, a photo mask is used to transfer patterns onto a resist film, and to thereby form a process mask (resist pattern). Then, dry etching or wet etching is performed using the process mask, to process a semiconductor wafer or various films disposed on the semiconductor wafer. In the ion implantation step S313, the semiconductor wafer is doped with phosphorous (P), boron (B), or arsenic (As), using a process mask. After the series of steps are finished, the process flow proceeds to the step S303.

(4) In the step S303 consisting of a back end process (surface interconnection process), an interconnection process is performed on the substrate surface. In the back end process, a chemical vapor deposition (CVD) step S315, a photo-resist coating step S316, a photolithography step S317, an etching step S318, and a metal deposition step S319 are repeatedly performed. After a multi-layer interconnection structure is completed by the series of steps, the process flow proceeds to the subsequent step S304.

(5) In the step S304, the wafer is divided into chips of a predetermined size by a dicing unit, such as a diamond blade. Then, each of the chips is mounted on a packaging component made of, e.g., metal or ceramic. Further, electrode pads on the chip are connected to leads of a lead frame by gold wires, and a predetermined package assembling, such as resin molding, is performed.

Then, in a step S400, each semiconductor integrated circuit thus produced is subjected to examinations on characteristics, such as the performance and function thereof, and other predetermined examinations on, e.g., the shape and size of leads, and reliability, so that completion of the semiconductor integrated circuit is confirmed. Then, in a step S500, semiconductor integrated circuits having passed through these examinations are packed to protect them from moisture, static electricity, and so forth, and are then shipped.

The method described above for manufacturing a semiconductor device according to the first embodiment, which utilizes a method of generating test patterns, makes it possible to swiftly and efficiently extract hazard shapes. This information is fed back to design rules, OPC rules, and/or verification rules to correct these rules as needed, so that the quality of design data and/or mask data can be improved. Further, the cost for mask data processing can be decreased, and the TAT can be shortened, which improves the process yield.

Second Embodiment

A method for generating test patterns according to a second embodiment of the present invention employs a circuit for measuring an electrical characteristic, which is different from the method for generating test patterns shown in the flow chart of FIG. 1. Otherwise, the method according to this embodiment is essentially the same as the method shown in the flow chart of FIG. 1, and thus the repetitive explanation thereof will be omitted.

Figure 9:
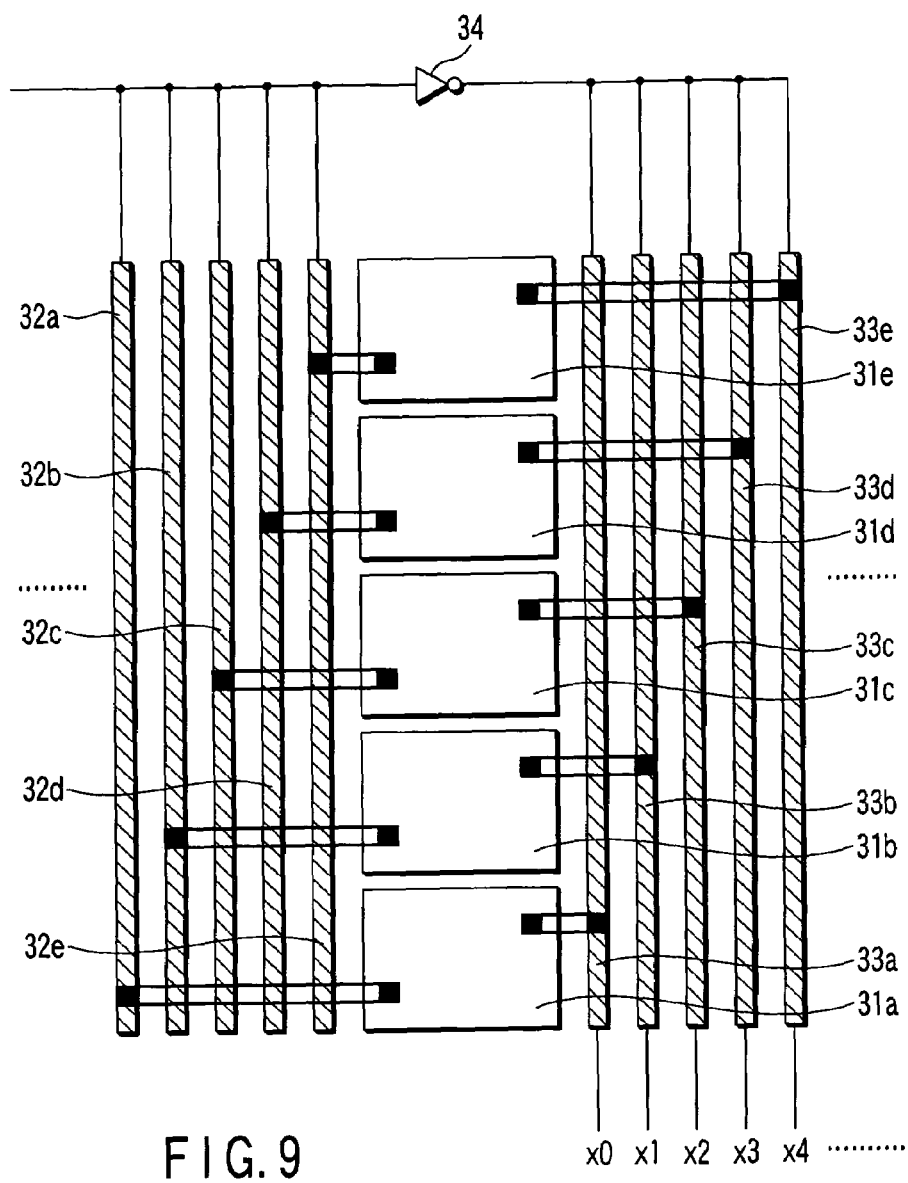
FIG. 9 is a view schematically showing a circuit for measuring an electrical characteristic of test patterns according to a second embodiment of the present invention.

FIG. 9 is a view schematically showing a circuit for measuring an electrical characteristic of test patterns according to the second embodiment of the present invention. As shown in FIG. 9, this circuit for measuring an electrical characteristic includes test pattern mounts 31a to 31e configured to respectively dispose therein test patterns as targets to be measured. The test pattern mounts 31a to 31e are respectively connected to first line portions 32a to 32e and second line portions 33a to 33e. The first line portions 32a to 32e and second line portions 33a to 33e are connected to an inverter 34.

Figure 10:
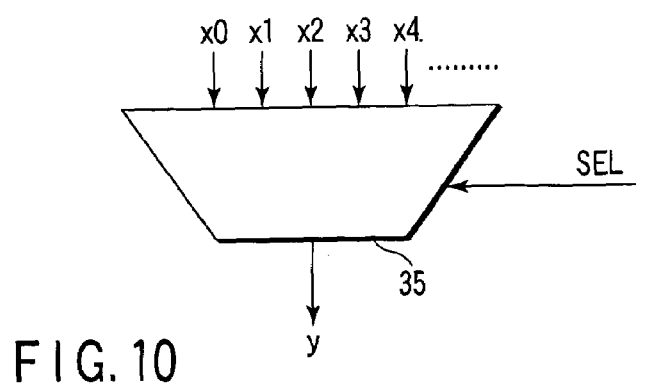
FIG. 10 is a view showing a multiplexer used as an analyzing portion in the circuit for measuring an electrical characteristic according to the second embodiment.

Further, the circuit for measuring an electrical characteristic includes a multiplexer 35 connected to the second line portions 33a to 33e to analyze test patterns disposed in the test pattern mounts 31a to 31e. FIG. 10 is a view showing the multiplexer 35 used as an analyzing portion in the circuit for measuring an electrical characteristic according to the second embodiment.

Figure 11:
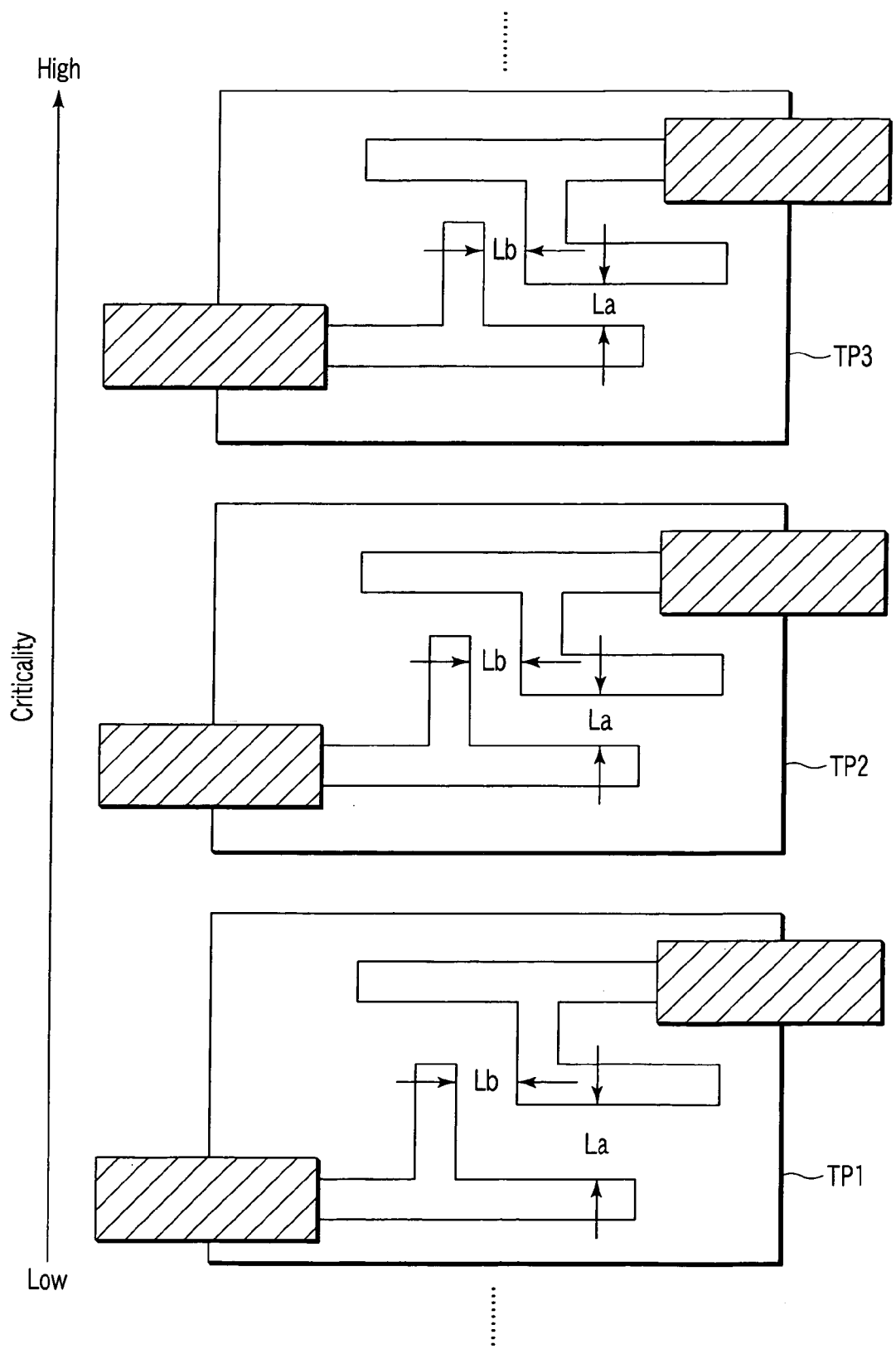
FIG. 11 is a view showing test patterns to be examined by the circuit for measuring an electrical characteristic according to the second embodiment.

FIG. 11 is a view showing test patterns to be examined by the circuit for measuring an electrical characteristic according to the second embodiment. The example shown in FIG. 11 includes three test patterns TP1, TP2, and TP3 different in pattern space sizes La and Lb, which may be disposed in this order in three of the test pattern mounts 31a to 31e. The lower side test pattern TP1 is set to have pattern space sizes of La=Lb=110 nm. The central test pattern TP2 is set to have pattern space sizes of La=Lb=100 nm. The upper side test pattern TP3 is set to have pattern space sizes of La=Lb=90 nm. With the decrease in the pattern space sizes La and Lb, the criticality in causing a short error is increased. Accordingly, the test patterns TP1, TP2, and TP3 are arrayed in increasing order of criticality, i.e., the upper side test pattern TP3 has the highest criticality.

Figure 12:
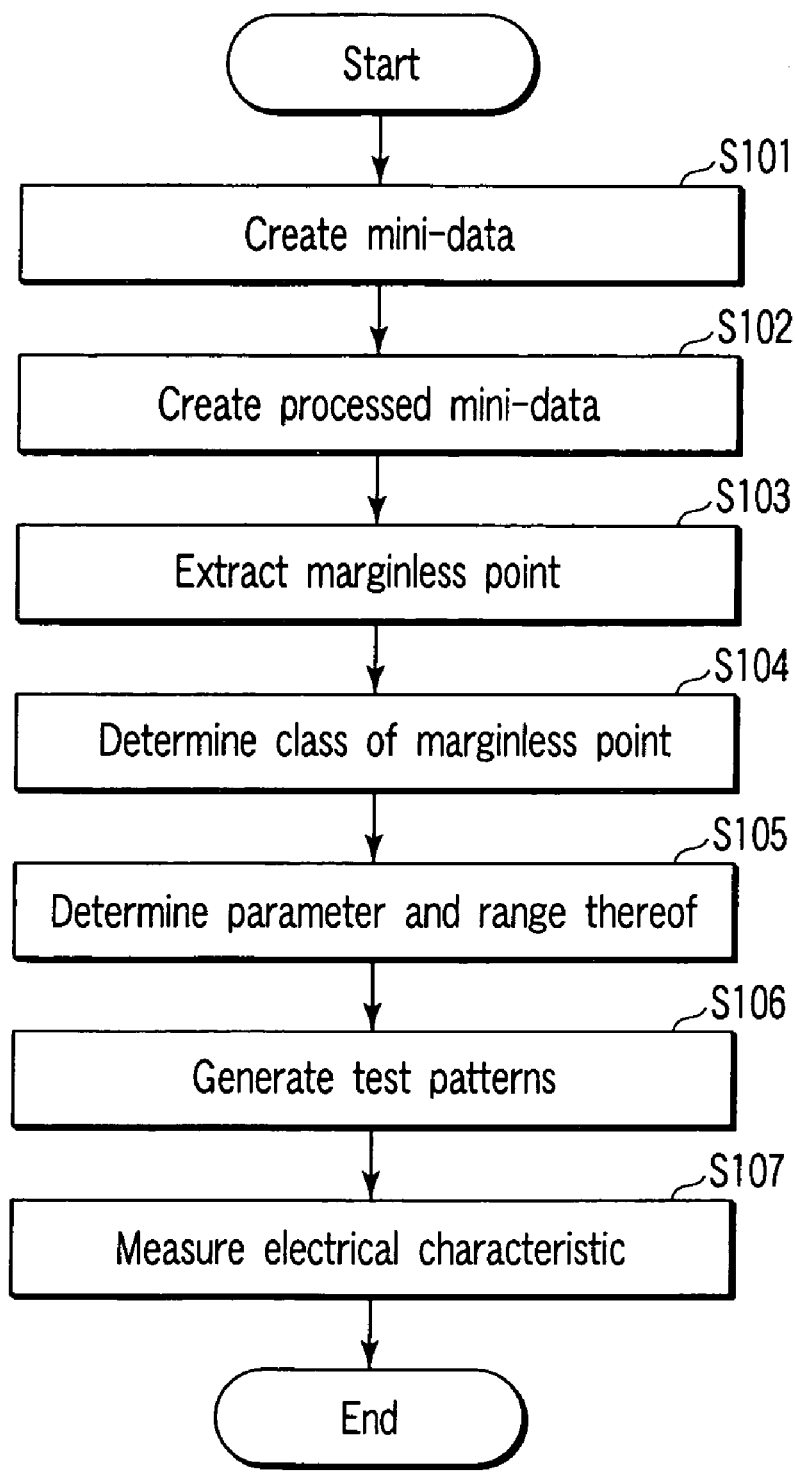
FIG. 12 is a flow chart showing a method for generating test patterns according to the second embodiment.

FIG. 12 is a flow chart showing a method for generating test patterns according to the second embodiment. Since steps S101 to S106 are the same as those of the first embodiment, a detailed explanation thereof will be omitted.

(1) In the step S101, mini-data is created, which concerns a partial area pattern used in designing a semiconductor device.

(2) In the step S102, the mini-data is subjected to data processing in accordance with a condition of a manufacturing process of the semiconductor device, thereby creating processed mini-data.

(3) In the step S103, a marginless point in the processed mini-data is extracted where a process margin is less than a predetermined threshold in a manufacturing process of the semiconductor device.

(4) In the step S104, a class of the marginless point is determined in accordance with the criticality and category of the marginless point.

(5) In the step S105, a parameter and a range of the parameter used for the marginless point are determined in accordance with the class of the marginless point.

(6) In the step S106, a plurality of test patterns are generated, to which different values of the parameter are respectively applied within the range. At this time, for example, the test patterns are generated to be connected to the circuit for measuring an electrical characteristic shown in FIG. 7, and are disposed in order of criticality.

(7) In the step S107, an electrical characteristic of the test patterns is measured. For example, in the circuit for measuring an electrical characteristic shown in FIG. 7, outputs x0, x1, x2, x3, - - - , xn, and selection signal SEL are input into and analyzed by the multiplexer to detect an test pattern that has caused an error. In this case, since the test patterns are arrayed in order of criticality, a pattern actually used for the design can be easily selected from patterns having criticalities lower than that of the test pattern that has caused an error.

The method described above for generating test patterns according to the second embodiment makes it possible to swiftly and efficiently extract hazard shapes. This information is fed back to design rules, OPC rules, and/or verification rules to correct these rules as needed, so that the quality of design data and/or mask data can be improved. Further, the cost for mask data processing can be decreased, and the TAT can be shortened, which improves the process yield. In addition, in the case of the method for generating test patterns according to the second embodiment, test patterns are arrayed in order of criticality, so the line width and/or line-space width that have caused an error can be easily specified in a pattern. Further, only an area of a pattern near the line width and/or line-space width that have caused an error requires observation by a scanning electron microscope (SEM), and thus the time necessary for verification can be shortened.

In the circuit for measuring an electrical characteristic according to the second embodiment, test patterns are arrayed in order of criticality in causing a short error. Alternatively, test patterns may be arrayed in order of criticality in causing another error, such as an open error, shorting error, or edge placement error.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for generating test patterns utilized in manufacturing a semiconductor device, the method comprising:
    creating mini-data concerning a partial area pattern used in designing the semiconductor device;
    subjecting the mini-data to data processing in accordance with a condition of a manufacturing process of the semiconductor device, thereby creating processed mini-data;
    extracting a marginless point in the processed mini-data where a process margin is less than a predetermined threshold in a manufacturing process of the semiconductor device;
    determining a class of the marginless point in accordance with a criticality and a category of the marginless point;
    determining a parameter and a range of the parameter used for the marginless point in accordance with the class of the marginless point; and
    generating a plurality of test patterns to which different values of the parameter are respectively applied within the range.

2. The method according to claim 1, wherein the test patterns are generated to be connected to a circuit for measuring an electrical characteristic of the test patterns.

3. The method according to claim 1, wherein the process margin comprises a margin for a lithography process.

4. The method according to claim 3, wherein the process margin comprises a margin selected from the group consisting of a focus margin, a dose margin, and an alignment margin.

5. The method according to claim 3, wherein the marginless point comprises a portion extracted in accordance with a possibility for causing an error selected from the group consisting of an open error, a short error, a shorting error, a corner short error, and an edge placement error.

6. The method according to claim 5, wherein said extracting a marginless point comprises examining the processed mini-data by a lithography simulation or design rule checker.

7. The method according to claim 3, wherein said extracting a marginless point comprises extracting a pattern centering on the marginless point within a range to which a proximity effect exerts.

8. The method according to claim 3, wherein the category of the marginless point comprises a category selected from the group consisting of a focus margin, a dose margin, an alignment margin, and an error generation manner.

9. The method according to claim 8, wherein said determining a class of the marginless point comprises using a lithography rule checker or design rule checker on the marginless point.

10. The method according to claim 3, wherein the parameter comprises a geometric parameter.

11. The method according to claim 10, wherein the parameter comprises a parameter selected from the group consisting of a line width, a line-space width, and a pattern positional shift amount.

12. The method according to claim 10, wherein the parameter comprises presence and absence of a jog that forms a step or cut in a pattern.

13. The method according to claim 3, wherein the data processing comprises a process selected from the group consisting of a mask data process, an optical proximity effect correction process, and a resolution enhancement technique process.

14. The method according to claim 1, wherein the criticality of the marginless point comprises a factor graded in accordance with a magnitude degree of the process margin.

15. The method according to claim 1, wherein the test patterns are disposed in order of criticality.

16. A computer readable medium containing program instructions for execution on a processor, which, when executed by the processor, cause a system for generating test patterns utilized in manufacturing a semiconductor device, to execute:
creating mini-data concerning a partial area pattern used in designing the semiconductor device;
subjecting the mini-data to data processing in accordance with a condition of a manufacturing process of the semiconductor device, thereby creating processed mini-data;
extracting a marginless point in the processed mini-data where a process margin is less than a predetermined threshold in a manufacturing process of the semiconductor device;
determining a class of the marginless point in accordance with a criticality and a category of the marginless point;
determining a parameter and a range of the parameter used for the marginless point in accordance with the class of the marginless point; and
generating a plurality of test patterns to which different values of the parameter are respectively applied within the range.

17. A method for making a photo mask utilized in manufacturing a semiconductor device, by transferring a pattern of mask data onto a mask substrate, wherein the mask data is created by:
creating mini-data concerning a partial area pattern used in designing the semiconductor device;
subjecting the mini-data to data processing in accordance with a condition of a manufacturing process of the semiconductor device, thereby creating processed mini-data;
extracting a marginless point in the processed mini-data where a process margin is less than a predetermined threshold in a manufacturing process of the semiconductor device;
determining a class of the marginless point in accordance with a criticality and a category of the marginless point;
determining a parameter and a range of the parameter used for the marginless point in accordance with the class of the marginless point;
generating a plurality of test patterns to which different values of the parameter are respectively applied within the range; and
performing a test using the test patterns, and feeding back a result of the test to a design rule to create the mask data.

18. The method according to claim 17, wherein the test patterns are generated to be connected to a circuit for measuring an electrical characteristic of the test patterns, and the test comprises measuring an electrical characteristic of the test patterns.

19. A method for manufacturing a semiconductor device, the method comprising:
creating mini-data concerning a partial area pattern used in designing the semiconductor device;
subjecting the mini-data to data processing in accordance with a condition of a manufacturing process of the semiconductor device, thereby creating processed mini-data;
extracting a marginless point in the processed mini-data where a process margin is less than a predetermined threshold in a manufacturing process of the semiconductor device;
determining a class of the marginless point in accordance with a criticality and a category of the marginless point;
determining a parameter and a range of the parameter used for the marginless point in accordance with the class of the marginless point;
generating a plurality of test patterns to which different values of the parameter are respectively applied within the range;
performing a test using the test patterns, and feeding back a result of the test to a design rule to create the mask data;
transferring a pattern image of a photo mask made in accordance with the mask data onto a photo-resist film to form a resist pattern on a target substrate on which the semiconductor device is to be manufactured; and
processing the target substrate while using the resist pattern as a mask.

20. The method according to claim 19, wherein the test patterns are generated to be connected to a circuit for measuring an electrical characteristic of the test patterns, and the test comprises measuring an electrical characteristic of the test patterns.

* * * * *